(12) United States Patent
Oshima

(10) Patent No.: US 10,033,348 B2
(45) Date of Patent: Jul. 24, 2018

(54) VARIABLE RF FILTER AND WIRELESS APPARATUS

(71) Applicant: NEC CORPORATION, Tokyo (JP)

(72) Inventor: Naoki Oshima, Tokyo (JP)

(73) Assignee: NEC CORPORATION, Minato-ku, Tokyo (JP)

( * ) Notice: Subject to any disclaimer, the term of this patent is extended or adjusted under 35 U.S.C. 154(b) by 2 days.

(21) Appl. No.: 15/502,028

(22) PCT Filed: May 26, 2015

(86) PCT No.: PCT/JP2015/002636
§ 371 (c)(1),
(2) Date: Feb. 6, 2017

(87) PCT Pub. No.: WO2016/021095
PCT Pub. Date: Feb. 11, 2016

(65) Prior Publication Data
US 2017/0244375 A1 Aug. 24, 2017

(30) Foreign Application Priority Data

Aug. 7, 2014 (JP) .................................. 2014-161352

(51) Int. Cl.
*H04B 1/06* (2006.01)
*H03H 7/01* (2006.01)
(Continued)

(52) U.S. Cl.
CPC ............. *H03H 7/0138* (2013.01); *H04B 1/10* (2013.01); *H04B 1/18* (2013.01)

(58) Field of Classification Search
None
See application file for complete search history.

(56) References Cited

U.S. PATENT DOCUMENTS 4,751,744 A * 6/1988 Pavio, Jr. ............. H03D 9/0675
330/54
4,864,644 A * 9/1989 Takahashi ............ H03D 7/1408
348/E7.053
(Continued)

FOREIGN PATENT DOCUMENTS

JP 4-56524 A 2/1992

OTHER PUBLICATIONS

Milad Darvishi et al., "Design of Active N-Path Filters", IEEE Journal of Solid-State Circuits, Dec. 2013, pp. 2962-2976, vol. 48, No. 12.

(Continued)

*Primary Examiner* — Lana N Le
(74) *Attorney, Agent, or Firm* — Sughrue Mion, PLLC

(57) ABSTRACT

There is provided a variable RF filter receiving an input differential radio frequency signal from a differential input terminals and allowing a radio frequency signal around a desired frequency to pass therethrough, wherein first passive mixers driven by a rectangular wave clock signal having an arbitrarily determined frequency are connected in parallel to a signal line across the differential input terminals and differential output terminals, and wherein a load of each of the first passive mixers is configured by inductors. Further, as a clock signal driving each of the first passive mixers, an odd-multiple-wave Lo signal (for example, a triple-wave Lo signal) is used, the signal having a frequency odd-multiple times (for example, three times) as high as that of the Lo signal which is the fundamental wave of the passing radio frequency signal.

9 Claims, 11 Drawing Sheets

(51) Int. Cl.
*H04B 1/10* (2006.01)
*H04B 1/18* (2006.01)

(56) References Cited

U.S. PATENT DOCUMENTS

| | | | | |
|---|---|---|---|---|
| 5,006,811 | A * | 4/1991 | Kruger | H03C 7/025 329/354 |
| 5,563,545 | A * | 10/1996 | Scheinberg | H03D 7/125 327/389 |
| 7,509,110 | B2 * | 3/2009 | Hayashi | H03D 7/1441 455/302 |
| 2006/0040634 | A1 * | 2/2006 | Wang | H03D 7/165 455/313 |
| 2007/0140382 | A1 * | 6/2007 | Qian | H04B 1/30 375/332 |
| 2012/0049926 | A1 * | 3/2012 | Shimizu | H03D 7/165 327/355 |
| 2013/0028363 | A1 | 1/2013 | Rofougaran et al. | |
| 2013/0157604 | A1 * | 6/2013 | Jantzi | H04B 1/3805 455/296 |
| 2014/0132357 | A1 | 5/2014 | Larson et al. | |

OTHER PUBLICATIONS

Amir Ghaffari, "Switched-RC radio frequency N-Path Filters", CTIT Ph. D Thesis Series, University of Twente, Mar. 27, 2013, pp. 10, 25-29, 47, 48, 59-64, 77, Issue 13, Part 244, [retrieved on Jul. 13, 2015].
Written Opinion for PCT/JP2015/002636, dated Jul. 21, 2015.
International Search Report for PCT/JP2015/002636, dated Jul. 21, 2015.

* cited by examiner

VARIABLE RF FILTER AND WIRELESS APPARATUS

CROSS REFERENCE TO RELATED APPLICATIONS

This is a National Stage of International Application No. PCT/JP2015/002636 filed May 26, 2015, claiming priority based on Japanese Patent Application No. 2014-161352 filed Aug. 7, 2014, the contents of all of which are incorporated herein by reference in their entirety.

TECHNICAL FIELD

The present invention relates to a variable RF filter and a wireless device, and particularly to a variable RF filter applied to an RF (Radio Frequency) circuit for wireless communication, and a wireless device including the variable RF filter mounted thereon.

BACKGROUND ART

In recent years, the spread of wireless communication has caused a problem of frequency tightness. For this reason, in order to handle the problem of the frequency tightness, a frequency management is proposed which dynamically manages frequencies statically assigned to wireless standards. Typical examples include Cognitive Radio in which another wireless system secondarily uses bands which are not used temporally/spatially in television broadcasting.

However, when the secondarily usable frequency bands are extensive, a broadband wireless device capable of supporting all of these frequency bands is required. When a communication frequency is switched in broadband, a filter for removing unnecessary waves has to be switched in conjunction therewith. However, when at least two RF (Radio Frequency) filters of RF circuit at the front end of a wireless device are configured to be arranged in parallel and switched, the device size increases enormously. In particular, mobile terminals with their limited device size and weight are often difficult even to allow RF filters to be arranged in parallel therein, compared to fixed base stations.

In particular, terrestrial television broadcasting, the above-mentioned representative example of television broadcasting, uses frequency bands which are UHF (Ultra High Frequency) and VHF (Very High Frequency), relatively low frequencies among frequency bands used in wireless communication. For this reason, constructing an RF filter by a transmission line leads to an enormous increase in the circuit size. Accordingly, a RF filter supporting broadband is preferably a variable RF filter consisting of lumped elements and capable of variably setting its frequency characteristics.

As an example of such a variable RF filter, an art described, for example, in Darvishi, M., "Design of Active N-Path Filters", Non Patent Literature 1 is disclosed. FIG. 11 is a circuit diagram depicting the outline of the variable RF filter described in Non Patent Literature 1, which is a conventional art.

In the circuit diagram of FIG. 11, reference signs 101 and 102 represent a differential input terminal IN and a differential input terminal INB, and reference signs 118, 119, and 120 represent a first filter block, a second filter block, and an n-th filter block (n: natural number), respectively. Further, reference signs from 103 to 106 represent switches in the first filter block 118, and reference signs from 108 to 111 represent switches in the second filter block 119, and reference signs from 113 to 116 represent switches in the n-th filter block 120. Still further, reference signs 107, 112, and 117 represent a capacitor in the first filter block 118, a capacitor in the second filter block 119, and a capacitor in the n-th filter block 120, respectively.

The variable RF filter shown in the circuit diagram of FIG. 11 has the n-stage filter blocks of a first filter block 118, a second filter block 119, and an n-th filter block 120, connected in parallel across a differential input terminal 101 and a differential input terminal 102. The first filter block 118 is configured by switches 103 to 106 and a capacitor 117, wherein the switch 103 and the switch 104 are connected in series, and the switch 105 and the switch 106 are connected in series, across the differential input terminal 101 and the differential input terminal 102, and wherein the capacitor 117 is connected across a connection point of the switch 103 and the switch 104 and that of the switch 105 and the switch 106. The other filter blocks, i.e., the second filter block 119, . . . , and the n-th filter block 120 have the same configuration.

Next, the operation of the variable RF filter shown in FIG. 11 will be explained by using an example of a variable RF filter having an four stage (n=4) configuration of filter blocks. FIG. 12 is a diagram of a clock signal waveform showing an example of a temporal waveform of a clock signal driving each switch of the variable RF filter in FIG. 112, wherein the number of the filter block stages is four, and it shows a clock signal waveform on the temporal axis, of clock signals having a duty ratio of 12.5%, i.e., 8-phase clock signals.

As shown in FIG. 12, among respective 8-phase clock signals (CLK1 (first clock signal) 201 to CLK8 (eighth clock signal) 208), CLK1 (first clock signal) 201 and CLK5 (fifth clock signal) 205, CLK2 (second clock signal) 202 and CLK6 (sixth clock signal) 206, CLK3 (third clock signal) 203 and CLK7 (seventh clock Signal) 207, and CLK4 (fourth clock signal) 204 and CLK8 (eighth clock signal) 208, are respectively paired rectangular waves consisting of waves shifted by a half cycle (½ cycle) with each other.

The respective paired clock signals are input into the respective switches 103 to 116 of the first filter block 118, the second filter block 119, . . . , and the n-th filter block 120 (n=4 in the case of FIG. 12). For example, one of the pair, CLK1 (first clock signal) 201, is input into the switch 103 and the switch 106 of the first filter block 118. The other of the pair, CLK5 (fifth clock signal) 205, is input into the switch 104 and the switch 105 of the first filter block 118. Thus, the respective filter blocks of the first filter block 118, the second filter block 119, . . . , and the n-th filter block 120 (n=4 in the case of FIG. 12) operate as switched capacitors.

FIG. 13 is a characteristic graph showing frequency characteristics of the switched capacitor, which is observed on the differential input terminal 101 and the differential input terminal 102 of the variable RF filter of FIG. 11. In FIG. 13, FIG. 13 (A) shows a frequency characteristic 301 of the capacitor alone, and FIG. 13 (B) shows a frequency characteristic 302 of the switched capacitor (passive mixer+ capacitor) for a clock signal CLK having a frequency of Fclk. While the frequency characteristic 301 of the capacitor alone of FIG. 13 (A) appears as a capacitor characteristic with a peak at a point of direct current (DC), the switched capacitor of FIG. 13 (3B) exhibits a capacitor characteristic around the frequency Fclk of the clock signal CLK.

If an Lo (Local Oscillator) signal (i.e., the locally oscillating signal (local oscillation signal)) of a down-converter in a wireless device of direct-conversion type is used as a clock signal CLK to drive the RF variable filter of FIG. 11, the filter can operate as an RF band-pass filter which allows to pass therethrough only a region near a desired frequency band for a differential RF signal (radio frequency signal) which is input from the differential input terminal 101 and the differential input terminal 102. This indicates that the frequency characteristic of the capacitor as a load is up-converted to the frequency Fclk of the clock signal CLK, i.e., the Lo signal frequency, by the passive mixer configured by switches. Accordingly, appropriate change in the Lo signal frequency can make the filter operate as a tuning-less variable RF filter, enabling constructing a filter suitable for broadband wireless communication apparatuses.

However, when a rectangular wave having a frequency Fclk, for example, a Lo signal frequency is used for the clock signal CLK, harmonics become problematic. FIG. 14 is a characteristic graph showing a circuit simulation result of the frequency characteristic of the RF variable filter of FIG. 11, and it shows a frequency characteristic for the Lo signal frequency of 150 MHz. The vertical axis represents a gain normalized by its maximum value, and the gain is shown to appear also near 450 MHz which is a third harmonic. This is also true for odd harmonics higher than or equal to the fifth harmonic. This is due to an effect of the operation of the switched capacitor by harmonics contained in the rectangular wave. Note that the signal attenuated, as desired, near an even harmonic such as the second harmonic is due to differential operation. As mentioned above, signals corresponding to odd harmonics of the Lo signal frequency cannot be attenuated. Accordingly, even if the variable RF filter of FIG. 11 is used, it is necessary to separately mount a filter to remove unnecessary waves related to odd harmonics having a frequency three times or more as high as the Lo signal frequency.

CITATION LIST

Non Patent Literature

[NPL 1] Darvishi, M.; "Design of Active N-Path Filters", IEEE Journal of Solid-State Circuits, vol. 48, November, 2013, pp. 2962-2976

SUMMARY OF INVENTION

Technical Problem

A problem to be solved by the present invention is, as mentioned above, to enable eliminating unnecessary waves in frequency bands corresponding to odd harmonics of the Lo signal frequency, the unnecessary waves being generated in a variable RF filter operating by using a rectangular Lo signal (rectangular-wave-like locally oscillating signal (local oscillation signal)) as a clock signal.

Object of Present Invention

An object of the present invention is to provide a variable RF filter and a wireless device which enable eliminating unnecessary harmonic components generated, during their operation, by a locally oscillating signal (local oscillation signal) using a rectangular wave.

Solution to Problem

In order to solve the above-mentioned problem, a variable RF filter and wireless device according to the present invention adopt mainly the characteristic configurations as follows.

(1) The variable RF filter according to the present invention is a variable RF filter capable of variably setting frequency, which is a variable RF filter receiving an input differential radio frequency signal and allowing a radio frequency signal around a desired frequency to pass therethrough, wherein a first passive mixer driven by a rectangular wave clock signal having an arbitrarily determined frequency is connected in parallel to a signal line across an input terminal and an output terminal, and wherein a load of the first passive mixer is configured by an inductor.

(2) A wireless device according to the present invention is a wireless device which at least includes a variable RF filter including at least one passive mixer and includes a down-converter using a local oscillation signal which is a rectangular wave, wherein the variable RF filter is configured by at least the variable RF filter according to (1), and wherein the frequency of the local oscillation signal is the same as that of the fundamental wave of the passing radio frequency signal at least in the variable RF filter according to the above (1).

Advantageous Effects of Invention

According to the variable RF filter and the wireless device of the present invention, the following effects are obtained.

Even when they operate, as a variable RF filter capable of variably setting the frequency characteristics, by a rectangular Lo signal (rectangular-wave-like locally oscillating signal (local oscillation signal)), they can reliably reduce unnecessary waves in frequency bands corresponding to the odd harmonics of the rectangular Lo signal, owing to their configuration in which passive mixers using an inductor as a load are connected in parallel and driven by a clock signal using a frequency odd-multiple times as high as that of the rectangular Lo signal.

DESCRIPTION OF EXAMPLE EMBODIMENTS

Now, preferable example embodiments of the variable RF filter and the wireless device according to the present invention will be described with reference to the attached drawings. The variable RF filter herein covers a variable RF filter which is applied to a wireless device including at least a down-converter using a rectangular Lo signal (a rectangular locally oscillating signal (local oscillation signal)), i.e., a local oscillation signal having a rectangular waveform, and which, as a variable RF filter receiving an input differential radio frequency signal and allowing to pass therethrough a radio frequency signal around a desired frequency, includes a lumped constant element and is capable of variably setting the frequency characteristic, wherein the variable RF filter operates by a rectangular-wave-like clock signal having an arbitrarily determined frequency, i.e., by a clock signal using a frequency once or multiple times as high as that of the rectangular Lo signal. Reference signs of drawing assigned to the following drawings are assigned, for convenience as examples for helping better understanding, to respective elements, and they are obviously not intended to limit the present invention to the illustrated example embodiments.

Features of the Present Invention

Prior to the description of the example embodiments of the present invention, the outline of the present invention will be described at first. The present invention is mainly a variable RF filter including a lumped element and being capable of variably setting frequency characteristics, which is a variable RF filter operating by a clock signal using a frequency once or multiple times as high as that of a rectangular Lo signal (rectangular locally oscillating signal (local oscillation signal)), wherein at least one passive mixer using an inductor as a load is connected in parallel to an input terminal for a differential radio frequency signal and operates at a frequency odd-multiple times as high as that of the rectangular Lo signal (locally oscillating signal (local oscillation signal)). Thus, the invention enables the RF filter to output reliably reduced unnecessary waves in frequency bands corresponding to odd harmonics of an Lo signal contained in the radio frequency signal passing therethrough.

First Example Embodiment

Figure 1:
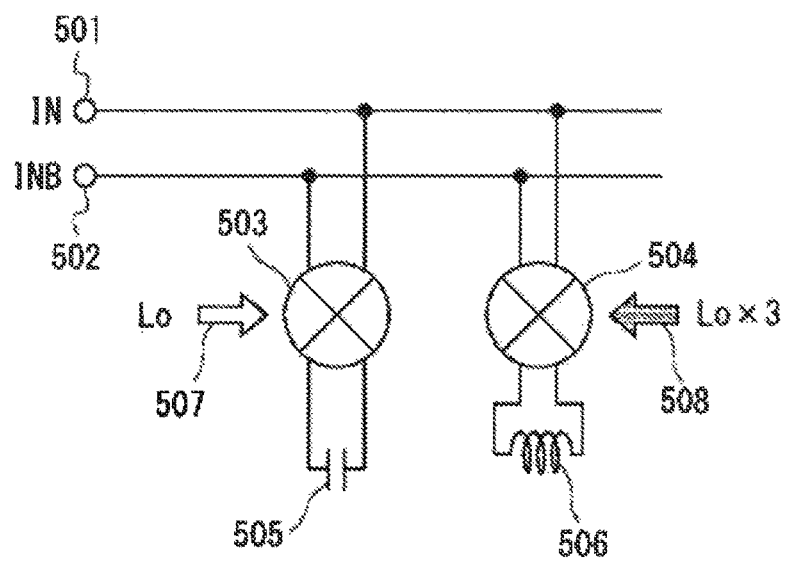
FIG. 1 is a circuit diagram showing an example of circuit configuration of a variable RF filter in a first example embodiment according to the present invention.

Next, a first example embodiment of the present invention will be described using the circuit diagram of FIG. 1. FIG. 1 is a circuit diagram showing an example of circuit configuration of a variable RF filter in the first example embodiment according to the present invention.

In the circuit diagram of FIG. 1, reference signs 501 and 502 indicate a differential input terminal IN and a differential input terminal INB, respectively, and reference signs 503 and 504 indicate a second passive mixer and a first passive mixer, respectively. Further, a reference sign 507 indicates an Lo signal (locally oscillating signal (local oscillation signal)) which is a clock signal driving the second passive mixer 503, and a reference sign 508 indicates a triple-wave Lo signal which is a triple-wave of the Lo signal and is a clock signal driving the first passive mixer 504. A reference sign 505 indicates a capacitor which is a load of the second passive mixer 503, and a reference sign 506 indicates an inductor which is a load of the first passive mixer 504. In the description below, the Lo signal and a clock signal CLK are used in the same meaning.

As a first example embodiment of the present invention, the variable RF filter shown in the circuit diagram of FIG. 1 has the first passive mixer 504 using the inductor 506 as a load, the mixer being connected, in parallel with the second passive mixer 503 using the capacitor 505 as a load, across the differential input terminal 501 and the differential input terminal 502 for a differential RF signal (radio frequency signal). In this filter, the second passive mixer 503 using the capacitor 505 as a load is a circuit for up-converting an input RF signal around the frequency of the clock signal applied for operation, i.e., the frequency of the Lo signal 507, while in contrast, the first passive mixer 504 using the inductor 506 as a load is a circuit for attenuating the gain of the input RF signal around the frequency of the clock signal applied for operation, i.e., the triple-wave Lo signal 508.

Accordingly, if the first passive mixer 504 is driven by the triple-wave Lo signal 508 having a frequency three times as high as that of the Lo signal along with the second passive mixer 503 driven by the Lo signal 507, the first passive mixer 504 using the inductor 506 as a load can reduce the gain of a signal corresponding to the wave having a frequency three times as high as that of the Lo signal (hereinafter triple-wave). In other words, by combining the frequency characteristic of the second passive mixer 503 using the capacitor 505 as a load and that of the first passive mixer 504 using the inductor 506 as a load, an RF filter can be configured which allows to pass therethrough only an RF signal in the vicinity of the desired frequency wave, from which signal the third harmonic component is removed. In a similar way, when a fifth harmonic component is desired to be removed, the filter may be configured in such a way that a mixer using an inductor as a load, which is driven at a frequency five times as high as that of the Lo signal (hereinafter quintuple-wave), is further connected in parallel. Further, in general, when it is desired to remove odd harmonic components having a frequency odd-multiple times as high as that of the Lo signal, the filter may be configured in such a way that a mixer having an inductor load is connected in parallel and driven at a frequency odd-multiple times as high as that of the Lo signal, but the detail of such a configuration is omitted herein.

Specific Example of Circuit Configuration of First Example Embodiment

Figure 2:
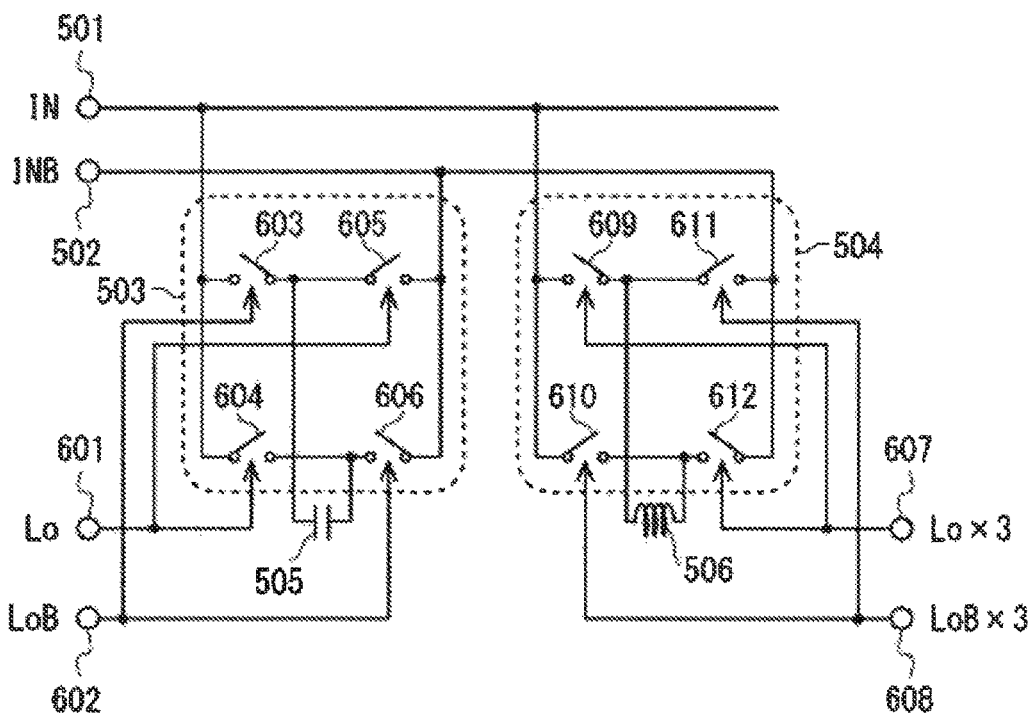
FIG. 2 is a circuit diagram showing an example of specific circuit configuration of the variable RF filter in the first example embodiment according to the present invention.

Next, an example of specific circuit configuration of the variable RF filter according to the first example embodiment will be described by using FIG. 2. FIG. 2 is a circuit diagram showing an example of specific circuit configuration of the variable RF filter in the first example embodiment according to the present invention.

In the circuit diagram of FIG. 2, the second passive mixer 503 having the capacitor 505 as a load, as shown in FIG. 1, is configured by switches 603 to 606 and driven by an Lo signal 601 and an LoB signal 602. In a similar way, the first passive mixer 504 having the inductor 506 as a load, as shown in FIG. 1, is configured by switches 609 to 612 and driven by a triple-wave Lo signal 607 and a triple-wave LoB signal 608 having respectively a frequency three times as high as that of the Lo signal 601 and the LoB signal 602. The Lo signal 601 and the LoB signal 602, and the triple-wave Lo signal 607 and the triple-wave LoB signal 608 are differential signals, respectively.

Figure 3:
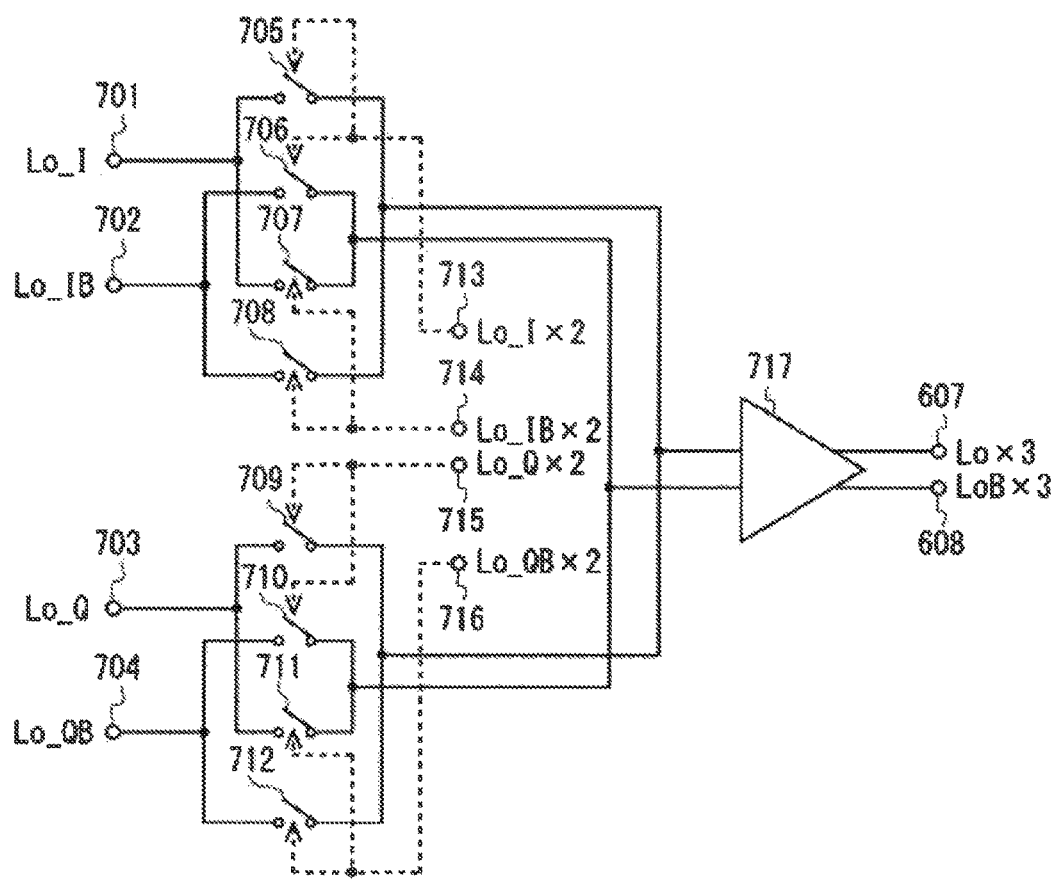
FIG. 3 is a circuit diagram showing an example of circuit configuration of a triple-wave-generating circuit for generating a triple-wave differential signal in the first example embodiment according to the present invention.

Further, the Lo signal 601 and the LoB signal 602 are locally oscillating signals (local oscillation signals) which are rectangular waves, and the triple-wave Lo signal 607 and the triple-wave LoB signal 608 are rectangular triple-waves of the Lo signal 601 and the LoB signal 602, respectively. With respect to a means for generating the triple-wave Lo signal 607 and the triple-wave LoB signal 608, commonly used oscillators can generated these waves, and the detailed description of the oscillators will be omitted herein. However, the oscillators typically increase power consumption at higher oscillation frequencies. For this reason, in order to realize a power-saving and small-scale variable RF filter which is an object of the present invention, Lo signals and double-wave Lo signals are preferably used to be synthesized, as shown in FIG. 3. FIG. 3 is a circuit diagram showing an example of circuit configuration of a triple-wave-generating circuit for generating a triple-wave differential signal in the first example embodiment of the present invention, and it shows a circuit configuration example for generating differential signals, i.e., the triple-wave Lo signal 607 and the triple-wave LoB signal 608, which are rectangular wave each having a frequency three times as high as that of each of the Lo signal 601 and the LoB signal 602.

In the circuit diagram shown in FIG. 3, into a direct conversion mixer configured by switches 705 to 712 are input not only an Lo_I signal 701 and an LoI_B signal 702, and LoQ signal 703 and Lo_QB signal 704, as differential signals for the Lo signal which have phases shifted by 90 degrees with respect to each other, but also a double-wave Lo_I signal 713 and a double-wave Lo_IB signal 714, and a double-wave Lo_Q signal 715 and a double-wave Lo_QB signal 716, as differential signals for the double-wave Lo signal, which are double-wave Lo signals having phases shifted by 90 degrees with respect to each other.

In other words, the Lo_I signal 701 is input into the respective input terminal side of the switch 705 and the switch 707. Further, the Lo_IB signal 702 which is a differential signal with respect to the Lo_I signal 701 is input into the respective input terminal sides of the switch 706 and the switch 708. Still further, the double-wave Lo_I signal 713 is input into the respective terminals for switching of the switch 705 and the switch 706. Still further, a double-wave Lo_IB signal 714 which is a differential signal with respect to the double-wave Lo_I signal 713 is input into the respective terminals for switching of the switch 707 and the switch 708.

In a similar manner, the Lo_Q signal 703 having a phase shifted by 90 degrees with respect to the Lo_I signal 701 is input into the respective input terminal sides of the switch 709 and the switch 711. Further, the Lo_QB signal 704 which is a differential signal with respect to the Lo_Q signal 703 is input into the respective input terminal sides of the switch 710 and the switch 712. Still further, the double-wave Lo_Q signal 715 is input into the respective terminals for switching of the switch 709 and the switch 710. Still further, the double-wave Lo_QB signal 716 which is a differential signal with respect to the double-wave Lo_Q signal 715 is input into the respective terminals for switching of the switch 711 and the switch 712. Thus, a group of 4-phase Lo signals is composed of the Lo_I signal 701, the Lo_IB signal 702, the Lo_Q signal 703, and the Lo_QB signal 704, and a group of 4-phase double-wave Lo signals is composed of the double-wave Lo_I signal 713, the double-wave Lo_IB signal 714, the double-wave Lo_Q signal 715, and the double-wave Lo_QB signal 716.

Next, the respective output terminal sides of the switch 705, the switch 708, the switch 709, and the switch 712 are interconnected to generate a triple-wave Lo_I signal, and the respective output terminal sides of the switch 706, the switch 707, the switch 710, and the switch 711 are interconnected to generate a triple-wave Lo_Q signal. A direct-conversion configuration like this generates only the triple-wave differential signals by signal synthesis of the Lo signal which is a fundamental wave and the double-wave Lo signal which is a double-wave thereof.

The generated triple-wave differential signals are respectively amplified by an amplifier 717, and then, drive the passive mixer 504 shown in FIG. 2 as differential signals of the triple-wave Lo signal 607 and the triple-wave LoB signal 608.

If the direct-conversion mixer shown in FIG. 3 is configured by an Lo signal and a double-wave Lo signal which are respectively either of the I or Q signals, a signal of not only the triple-wave but also the fundamental wave is generated. When the passive mixer 504 is driven by a signal containing the fundamental wave like this, attenuation due to the inductor load 506 of the passive mixer 504 will occur not only near the frequency of the triple-wave but also near that of the fundamental wave. Accordingly, 4-phase Lo signals and 4-phase double-wave Lo signals are necessary which respectively use Lo signals and double-wave Lo signals which are both I and Q signals.

Figure 4A:
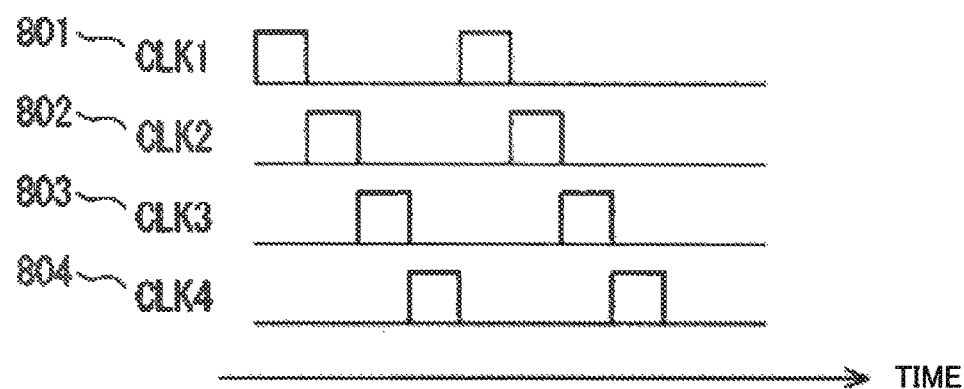
FIG. 4A is a clock signal waveform chart showing an example of temporal waveform of clock signals which are input into the variable RF filter in FIG. 2 and into the triple-wave-generating circuit in FIG. 3.

Next, a complementary description of the signal waveform of the clock signals in the first example embodiment of the present invention will be made by using FIG. 4. FIG. 4 are clock signal waveforms diagram showing an example of temporal waveform of clock signals input into the variable RF filter of FIG. 2 and into the triple-wave generation circuit of FIG. 3, and they show an example of rectangular waveform of the clock signals on the temporal axis. Usually, a circuit using a capacitor and switches, such as a switched capacitor, uses clock signals of a rectangular wave having a small duty ratio, such as CLK1 (first clock signal) 801 to CLK4 (fourth clock signal) 804 shown in FIG. 4A, for clock signals driving the switches. The reason is that clock signals having a narrower pulse width exhibit a higher Quality factor, enabling obtaining a steep characteristic.

Figure 4B:
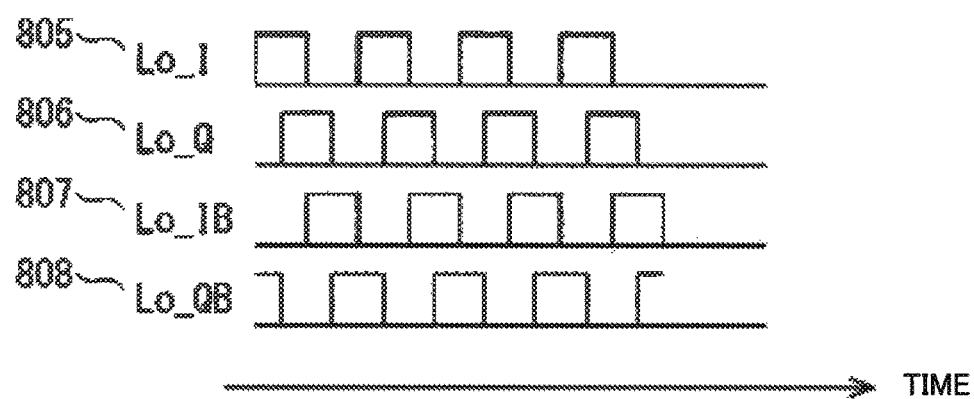
FIG. 4B is a clock signal waveform chart showing an example of temporal waveform of clock signals which are input into the variable RF filter in FIG. 2 and into the triple-wave-generating circuit in FIG. 3.

On the other hand, a converter mixer represented by the direct-conversion mixer as shown in FIG. 3 uses differential signals of IQ (i.e., 4-phase clock signals), such as the Lo_I signal 805, the Lo_Q signal 806, the Lo_IB signal 807, and the Lo_QB signal 808, as shown in FIG. 4B. However, as shown in, for example, the Lo_I signal 805 and the Lo_Q signal 806 in FIG. 4B, when signals having temporal intervals at High Level which overlap with each other are used for a mixer having a capacitor load such as the second passive mixer 503 in FIG. 2, conduction across the capacitor occurs, disabling a desired operation. Contrary to this, for example a differential mixer having an inductor load such as the first passive mixer 504 in FIG. 2 can use differential signals of IQ, such as the Lo_I signal 805 to the Lo_QB signal 808 as shown in FIG. 4B (i.e., a 4-phase clock signal). However, it cannot use signals, such as CLK 1 (first clock signal) 801 to CLK 4 (fourth clock signal) 804 in FIG. 4A, which are not differential signals.

Second Example Embodiment

Figure 5:
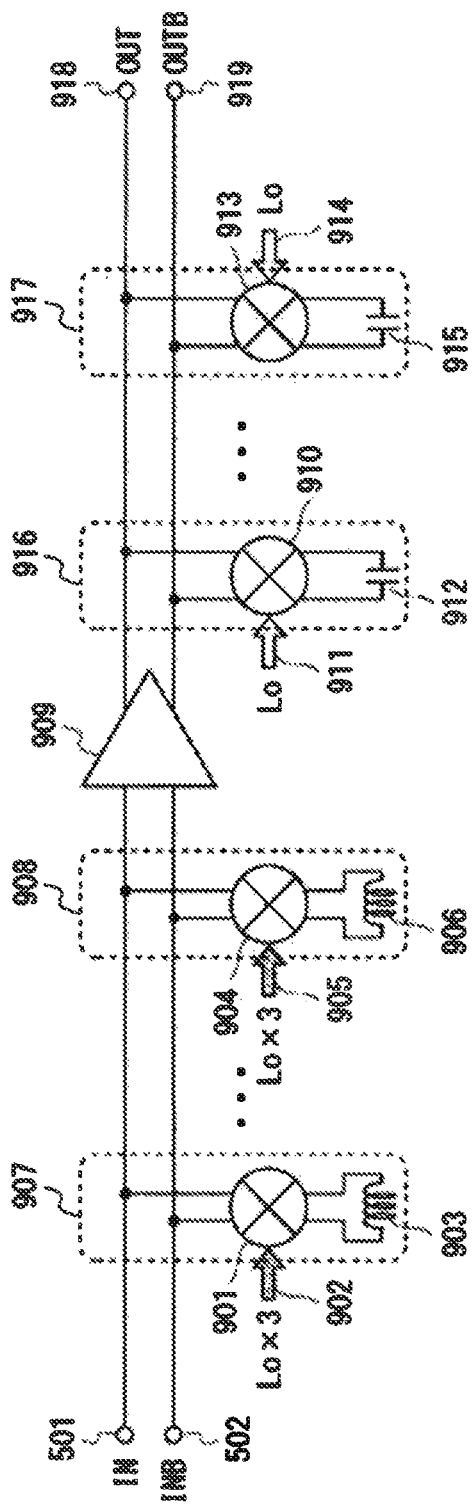
FIG. 5 is a circuit diagram showing an example of circuit configuration of a variable RF filter in a second example embodiment according to the present invention.

Next, a second example embodiment of the present invention will be explained by using the circuit diagram of FIG. 5. FIG. 5 is a circuit diagram showing an example of circuit configuration of a variable RF filter in the second example embodiment according to the present invention. The circuit is configured by at least two elements of the variable RF filter shown in FIG. 2 of the first example embodiment (i.e., second passive mixers using a capacitor as a load and first passive mixers using an inductor as a load) arranged in parallel across the differential input terminal 501 and the differential input terminal 502 for a differential RF signal (radio frequency signal).

In other words, a variable RF filter according to the second example embodiment of the present invention has a configuration, as shown in the circuit diagram of FIG. 5, at least including n inductor filters, disposed on the first stage side thereof, from a first inductor filter 907 configured by an eleventh passive mixer 901 using an inductor 903 as a load to an n-th inductor filter 908 configured by a 1n-th passive mixer 904 using an inductor 906 as a load, and n capacitor filters, disposed on the second stage side thereof, from a first capacitor filter 916 configured by a 21st passive mixer 910 using a capacitor 912 as a load to an n-th capacitor filter 917 configured by a 2n-th passive mixer 913 using a capacitor 915 as a load.

Each from the first inductor filter 907 to the n-th inductor filter 908 is driven by each of clock signals from a triple-wave Lo signal 902 to a triple-wave Lo signal 905. On the other hand, each from the first capacitor filter 916 to the n-th capacitor filter 917 is driven by each of clock signals from an Lo signal 911 to an Lo signal 914. The n-th capacitor filter 917 at the final stage is connected to a differential output terminal (OUT) 918 and a differential output terminal (OUTB) 919 for a differential RF signal (radio frequency signal).

As described above in the first example embodiment, the type of clock signals which can be used for the n inductor filters and that for the n capacitor filters are different from each other. For this reason, in order for both of the filter groups not to interfere with each other, an amplifier 909 for amplifying the RF signal is interposed between the respective stages of the filter groups, to improve isolation between them. Accordingly, a problem does not occur which causes the conduction of the capacitors 912 to 915 which are loads of the first capacitor filter 916 to the n-th capacitor filter 917 even if triple-wave IQ signals which are respectively the Lo_I signal 805, the Lo_Q signal 806, the Lo_IB signal 807, and the Lo_QB signal 808 shown in FIG. 4 of the first example embodiment are used as a triple-wave Lo signal 902, . . . , and a triple-wave Lo signal 905 which are respectively clock signals of the first inductor filter 907, . . . , and n-th inductor filter 908.

In other words, the second example embodiment in which the amplifier 909 is provided between the stages enables selecting independently clock signals driving the inductors from the first inductor filter 907 to the n-th inductor filter 908 and the capacitors from the first capacitor filter 916 to the n-th capacitor filter 917.

The circuit diagram of FIG. 5 shows a case where the same triple-wave Lo signal is used for all n inductor filters as a clock signal driving the respective n inductor filters from the first inductor filter 907 to the n-th inductor filter 908. However, the present invention is not limited to this case, and signals having a different frequency depending on the respective inductors filters may be used, the signals being, for example, odd-multiple-wave Lo signals having a frequency odd-multiple times as high as that of the Lo signal (i.e., clock signals having a frequency odd-multiple times as high as that of the fundamental wave of the passing radio frequency signal (RF signal)).

Further, the circuit diagram of FIG. 5 shows a case where the n inductor filters from the first inductor filter 907 to the n-th inductor filter 908 are mounted on the first stage side, and the n capacitor filters from the first capacitor filter 916 to the n-th capacitor filter 917 are mounted on the second stage side. However needless to say, in a manner of reversed mounting order, the n capacitor filters from the first capacitor filter 916 to the n-th capacitor filter 917 may be mounted on the first stage side, and the n inductor filters from the first inductor filter 907 to the n-th inductor filter 908 may be mounted on the second stage side.

Third Example Embodiment

Figure 6:
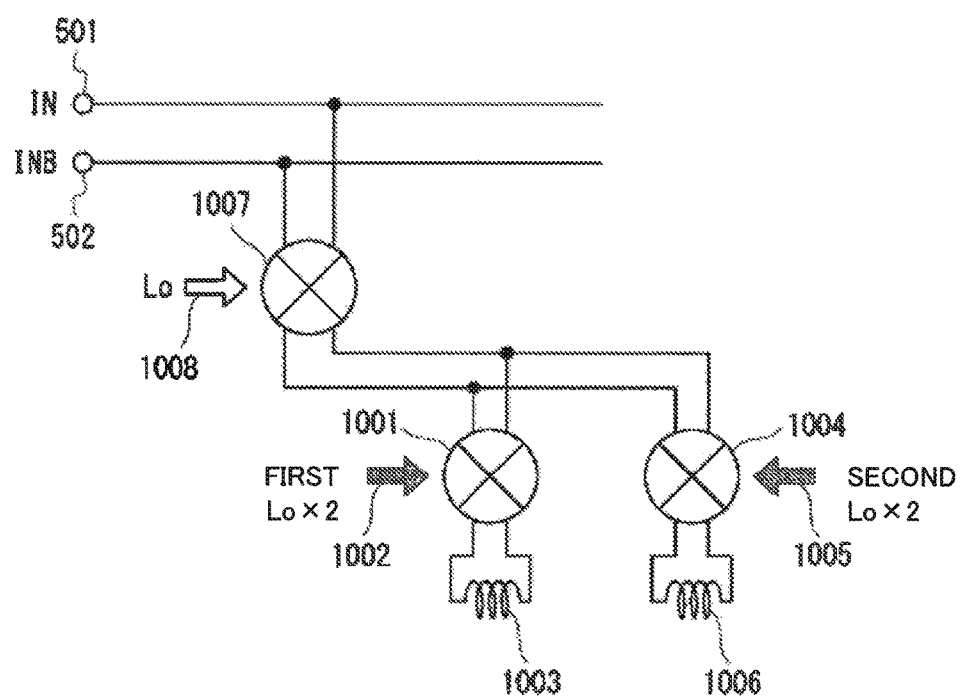
FIG. 6 is a circuit diagram showing an example of circuit configuration of a variable RF filter in a third example embodiment according to the present invention.

Next, a third example embodiment of the present invention will be described by using the circuit diagram of FIG. 6. FIG. 6 is a circuit diagram showing an example of circuit configuration of a variable RF filter in the third example embodiment according to the present invention.

The variable RF filter according to the third example embodiment of the present invention has a configuration, as shown in the circuit diagram of FIG. 6, in which two inductor filters, i.e., an eleventh passive mixer 1001 using an inductor 1003 as a load and a twelfth passive mixer 1004 using an inductor 1006 as a load, are connected as loads of a main passive mixer 1007 connected in parallel across the differential input terminal 501 and the differential input terminal 502 for a differential RF signal (radio frequency signal), As shown in the circuit diagram of FIG. 6, the main passive mixer 1007 operates by an Lo signal 1008, and the eleventh passive mixer 1001 and the twelfth passive mixer 1004 operate respectively by a first double-wave Lo signal 1002 and a second double-wave Lo signal 1005 both of which are double-waves of the Lo signal. Since each of the main passive mixer 1007, the eleventh passive mixer 1001, and the twelfth passive mixer 1004 is a differential circuit, the respective phases of the first double-wave Lo signal 1002 and the second double-wave Lo signal 1005 with respect to the Lo signal 1008 can be classified into three types as shown in the signal waveform diagram of FIG. 7.

Figure 7A:
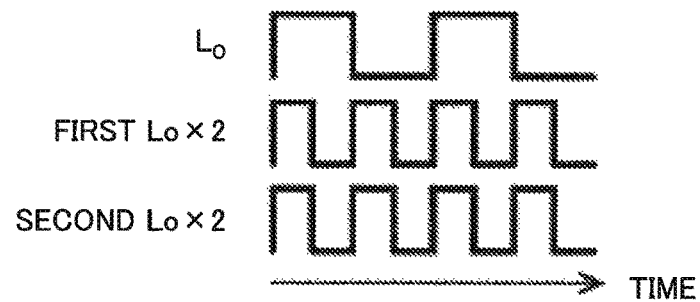
FIG. 7A is a clock signal waveform chart showing an example of temporal waveform of clock signals which are input into the variable RF filter in FIG. 6.
Figure 7B:
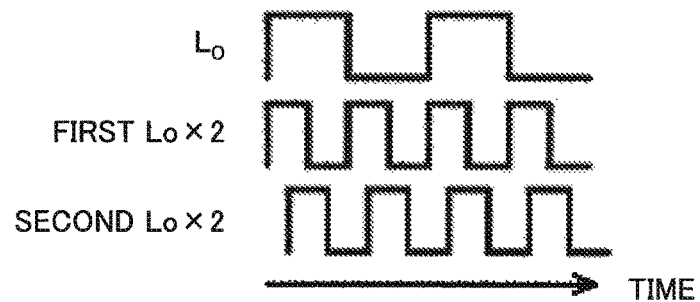
FIG. 7B is a clock signal waveform chart showing an example of temporal waveform of clock signals which are input into the variable RF filter of FIG. 6.
Figure 7C:
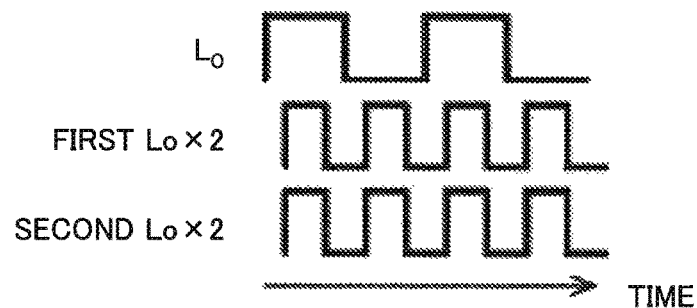
FIG. 7C is a clock signal waveform chart showing an example of temporal waveform of clock signals which are input into the variable RF filter of FIG. 6.

FIG. 7A, FIG. 7B, and FIG. 7C are clock signal waveform diagrams showing an example of temporal waveform of clock signals input into the variable RF filter of FIG. 6, and it illustrates rising timings of the Lo signal 1008, the first double-wave Lo signal 1002, and the second double-wave Lo signal 1005, which are respective clock signals of the main passive mixer 1007, the eleventh passive mixer 1001, and the twelfth passive mixer 1004.

FIG. 7A shows a case where the rising timing of each of the Lo signal 1008, the first double-wave Lo signal 1002, and the second double-wave Lo signal 1005 has no phase difference, i.e., a phase difference of '0 degree'. Further, FIG. 7B shows a case where the rising timings of the Lo signal 1008 and the first double-wave Lo signal 1002 have no phase difference but only the rising timing of the second double-wave Lo signal 1005 has a phase difference of '45 degrees' with respect to the Lo signal 1008 and the first double-wave Lo signal 1002. Still further, FIG. 7C shows a case where the rising timings of both of the first double-wave Lo signal 1002 and the second double-wave Lo signal 1005 have a phase difference of '45 degrees' with respect to the fundamental-wave Lo signal 1008.

Figure 8A:
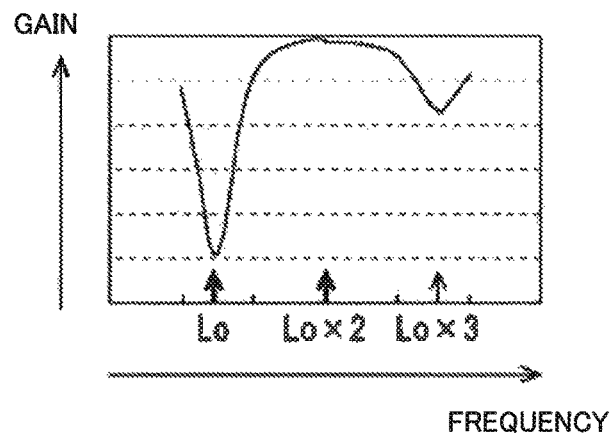
FIG. 8A is a characteristic graph showing an example of frequency characteristic of the variable RF filter of FIG. 6 operating by each of the clock signals of FIG. 7A.
Figure 8B:
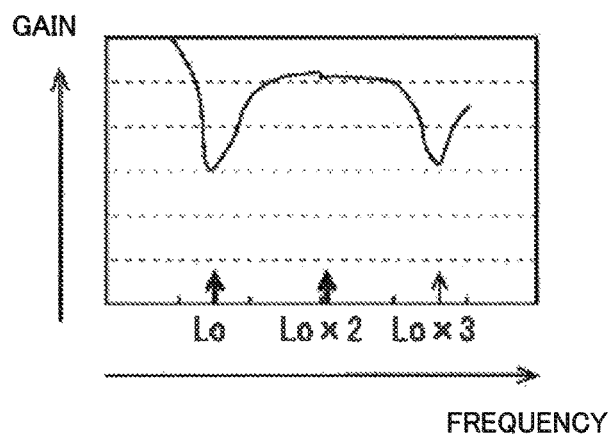
FIG. 8B is a characteristic graph showing an example of frequency characteristic of the variable RF filter of FIG. 6 operating by each of the clock signals of FIG. 7B.
Figure 8C:
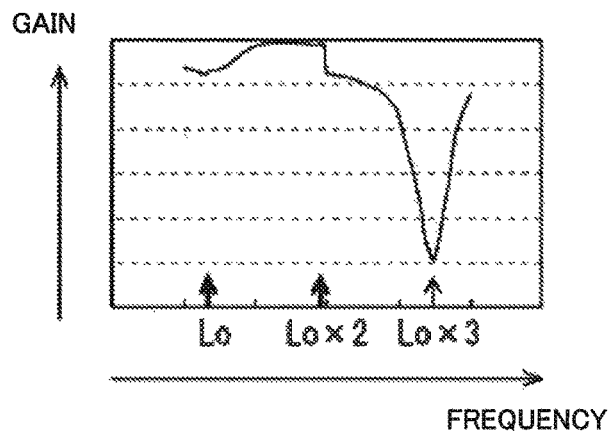
FIG. 8C is a characteristic graph showing an example of frequency characteristic of the variable RF filter of FIG. 6 operating by each of the clock signals of FIG. 7C.

The frequency characteristics of the variable RF filter of FIG. 6 driven by using the respective clock signals having the three types of phases shown in FIGS. 7A, 7B, and 7C are as shown in characteristic graphs in FIGS. 8A, 8B, and 8C. FIGS. 8A, 8B, and 8C are characteristic graphs showing an example of frequency characteristic of the variable RF filter of FIG. 6 operating by each of the three types of clock signals in FIGS. 7A, 7B, and 7C, and it shows a gain normalized by a maximum gain value on the vertical axis with frequency on horizontal axis. FIG. 8A shows a frequency characteristic of the variable RF filter in a case where the Lo signal 1008, the first double-wave Lo signal 1002, and the second double-wave Lo signal 1005 in FIG. 7A have a phase difference of '0 degree'. Further, FIG. 8B shows a frequency characteristic of the variable RF filter in a case where only the second double-wave Lo signal 1005 in FIG. 7B has a phase difference of '45 degrees' with respect to the Lo signal 1008 and the first double-wave Lo signal 1002. Still further, FIG. 8C shows a frequency characteristic of the variable RF filter in a case where both of the first double-wave Lo signal 1002 and the second double-wave Lo signal 1005 in FIG. 7C have a phase difference of '45 degrees' with respect to the Lo signal 1008.

As shown in FIG. 8A, when the Lo signal 1008, the first double-wave Lo signal 1002, and the second double-wave Lo signal 1005 have a phase difference of '0 degree', the gain of the RF signal is reduced near the frequency of the fundamental-wave Lo signal. Further, as shown in FIG. 8C, when both of the first double-wave Lo signal 1002 and the second double-wave Lo signal 1005 have a phase difference of '45 degrees' with respect to the Lo signal 1008, the gain of the RF signal is reduced near the frequency of the triple-wave Lo signal three times as high as that of the fundamental wave. Accordingly, as shown in FIG. 7C, if the variable RF filter of FIG. 6 operates by the clock signals in which the first double-wave Lo signal 1002 and the second double-wave Lo signal 1005 both have a phase difference of '45 degrees' with respect to the Lo signal 1008, the gain only near the triple-wave of the fundamental-wave can be reduced by using the fundamental wave Lo signal and the double-wave Lo signal which is the double-wave of the fundamental wave. Accordingly, the removal of the third harmonic wave can be achieved, which is an object of the present invention.

Further, as shown in FIG. 8B, when only the second double-wave Lo signal 1005 has a phase difference of '45 degrees' with respect to the Lo signal 1008 and the first double-wave Lo signal 1002, the gain of the RF signal can be simultaneously reduced near the frequency of the fundamental-wave Lo signal and the frequency of the triple-wave Lo signal. Accordingly, if the Lo signal 1008 operating the main passive mixer 1007 is used as a fundamental wave in such a way that each of the eleventh passive mixer 1001 and the twelfth passive mixer 1004 operates by the quadruple-wave of the fundamental wave, i.e., the quadruple-wave Lo signal, the frequency characteristic shown in FIG. 8B is obtained which is a characteristic capable of reducing simultaneously the gain of the RF signal near the frequency of the triple-wave Lo signal and near the frequency of a quintuple-wave Lo signal. Accordingly, the removal of the third harmonic and the fifth harmonic can be simultaneously achieved, which is another object of the present invention.

Further, when it is desired to remove simultaneously not only the third harmonic and the fifth harmonic, but also at least two odd harmonics, at least two first passive mixers using an inductor as a load may be connected in parallel as loads of the main passive mixer 1007 and driven by using an even-multiple-wave Lo signal having a frequency even-multiple times as high as that of the Lo signal (i.e., an even-multiple-wave clock signal having a frequency even-multiple times as high as that of a passing radio frequency signal which is a fundamental wave).

Fourth Example Embodiment

Figure 9:
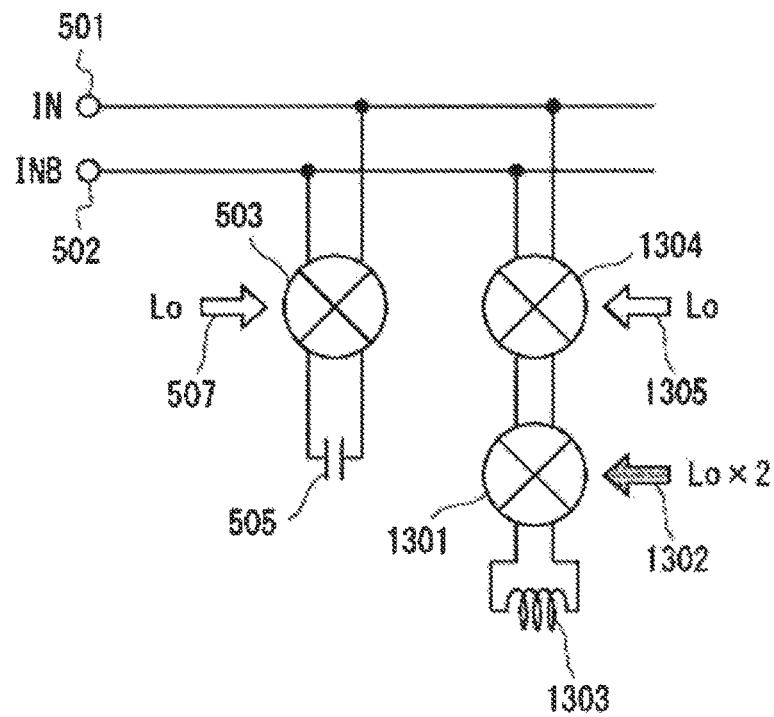
FIG. 9 is a circuit diagram showing an example of circuit configuration of a variable RF filter in a fourth example embodiment according to the present invention.

Next, a fourth example embodiment of the present invention will be described by using a circuit diagram of FIG. 9. FIG. 9 is a circuit diagram showing an example of the circuit configuration of a variable RF filter in the fourth example embodiment according to the present invention.

The variable RF filter in the fourth example embodiment according to the present invention includes, as shown in the circuit diagram of FIG. 9, a second passive mixer 503 using a capacitor 505 as a load and a main passive mixer 1304, connected in parallel across the differential input terminal 501 and the differential input terminal 502 for a differential RF signal (radio frequency signal). Further, it includes a first passive mixer 1301 using an inductor 1303 as a load, which mixer connected as a load of the main passive mixer 1304. The second passive mixer 503 using the capacitor 505 as a load is the same as the second passive mixer 503 shown in FIG. 1 of the first example embodiment, and the first passive mixer 1301 using the inductor 1303 as a load is the same as the eleventh passive mixer 1001 shown in FIG. 6 of the third example embodiment.

As shown in the circuit diagram of FIG. 9, the second passive mixer 503 operates by the fundamental-wave Lo signal 507, and the main passive mixer 1304 also operates by the fundamental-wave Lo signal 1305, but the first passive mixer 1301 operates by a double-wave Lo signal 1302 which is a double-wave of the Lo signal. As in the case of FIG. 6 of the third example embodiment, the main passive mixer 1304 and the first passive mixer 1301 are differential circuits, but the number of passive mixers operating by the double-wave Lo signal is one, which is fewer than in the case of FIG. 6. Accordingly, the phases of the Lo signal 1305 driving the main passive mixer 1304 and the double-wave Lo signal 1302 driving the first passive mixer 1301 are only of the two types in FIGS. 7A and 7C shown in the third example embodiment.

Even in the case of the clock signals having two types of phases such as above, if only the removal of the third harmonic wave is carried out which is an object of the present invention, the variable RF filter of FIG. 9 may be made operate by using, as shown in FIG. 7C, a signal having a phase difference of '45 degrees' with respect to the Lo signal 1008, as the double-wave Lo signal 1302. Since this operation enables reducing a gain only in the vicinity of the triple-wave of the fundamental wave, the reduction of the third harmonic can be achieved which is an object of the present invention.

The circuit diagram of FIG. 9 shows a case where only one first passive mixer 1301 using the inductor 1303 as a load is connected as a load of the main passive mixer 1304 connected in parallel to the second passive mixer 503. However, in order to handle a case where it is desired to remove odd harmonics having a frequency once or multiple times as high as that of the fundamental wave, at least two first passive mixers using an inductor as a load may obviously be configured in such a way as to be connected in parallel as loads of the main passive mixer 1304.

Fifth Example Embodiment

Figure 10:
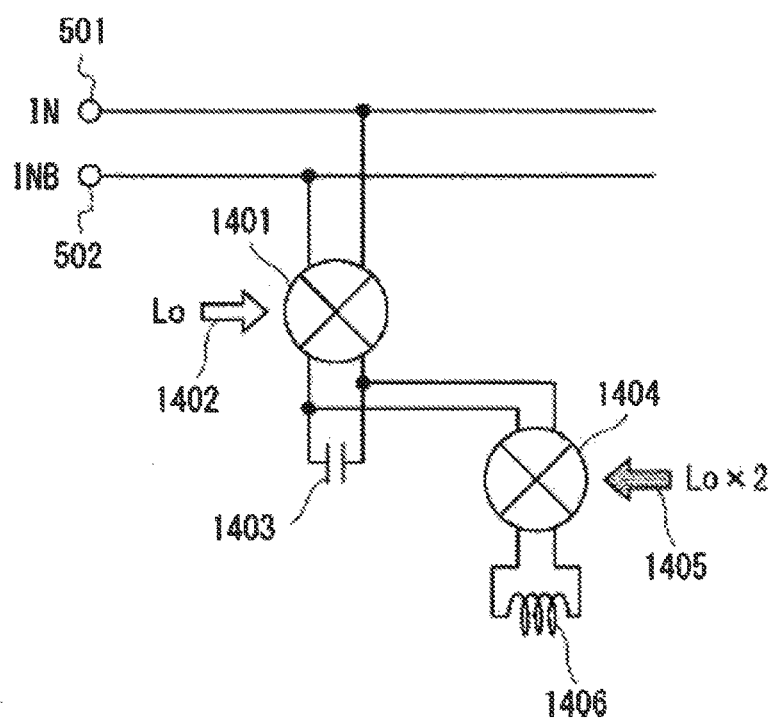
FIG. 10 is a circuit diagram showing an example of circuit configuration of a variable RF filter in a fifth example embodiment according to the present invention.
Figure 11:
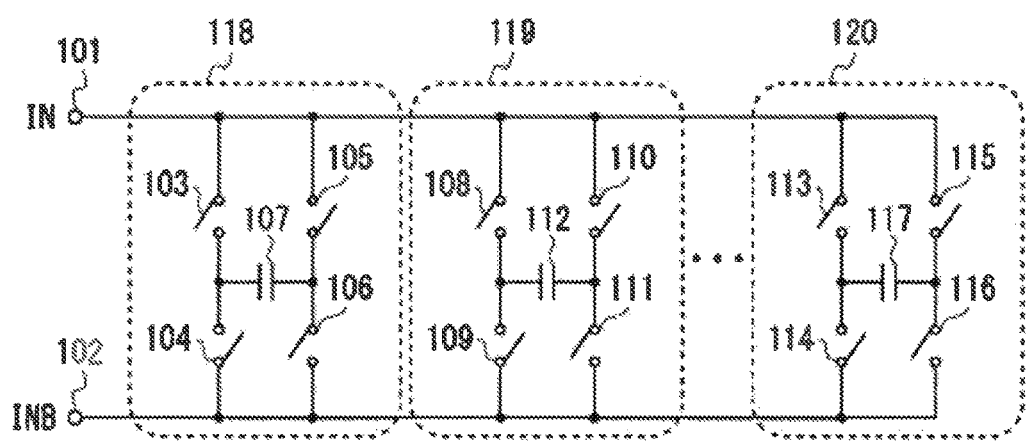
FIG. 11 is a circuit diagram showing an outline of the variable RF filter described in Non Patent Literature 1 as a conventional art.
Figure 12:
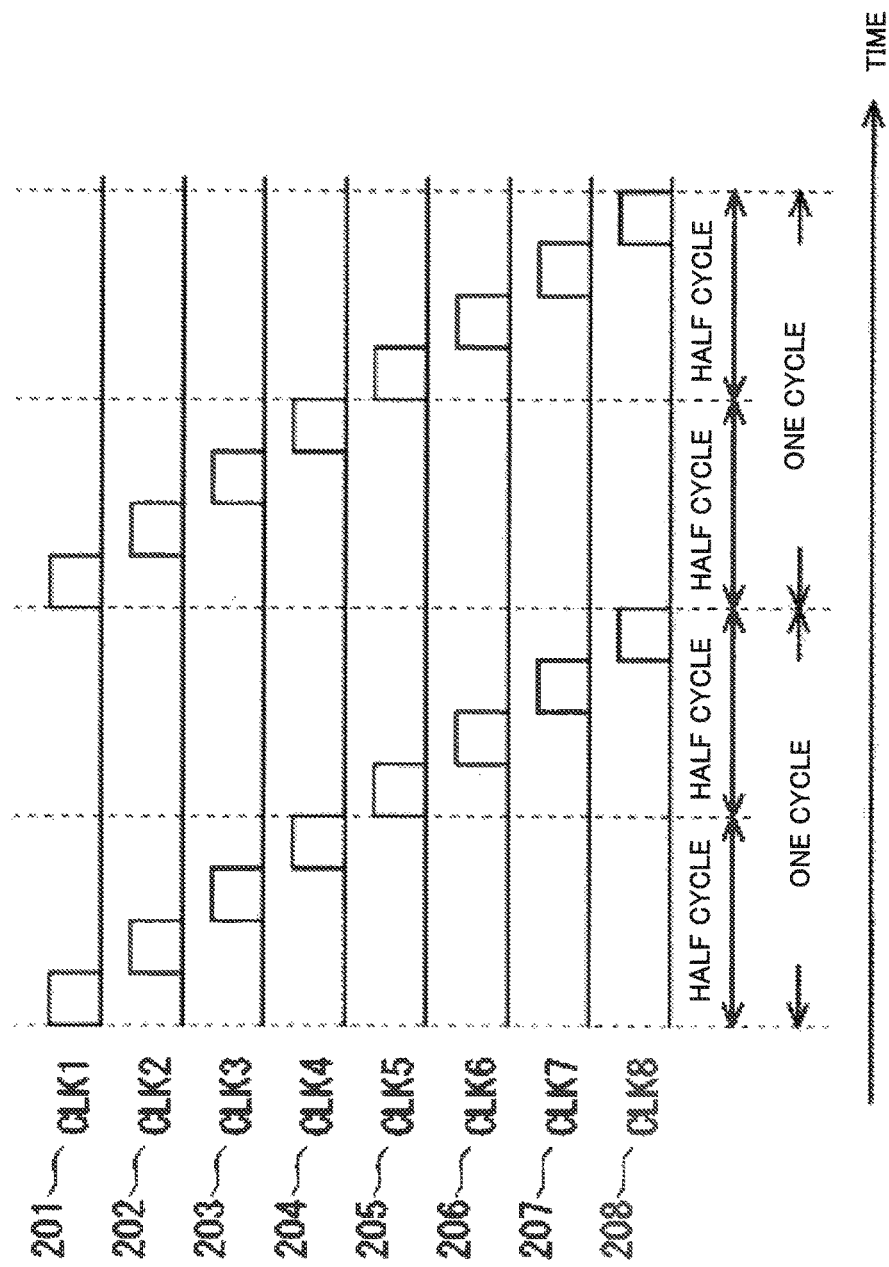
FIG. 12 is a clock signal waveform chart showing an example of temporal waveform of clock signals driving the respective switches of the variable RF filter in FIG. 11 in the configuration of four-stage filter blocks.
Figure 13:
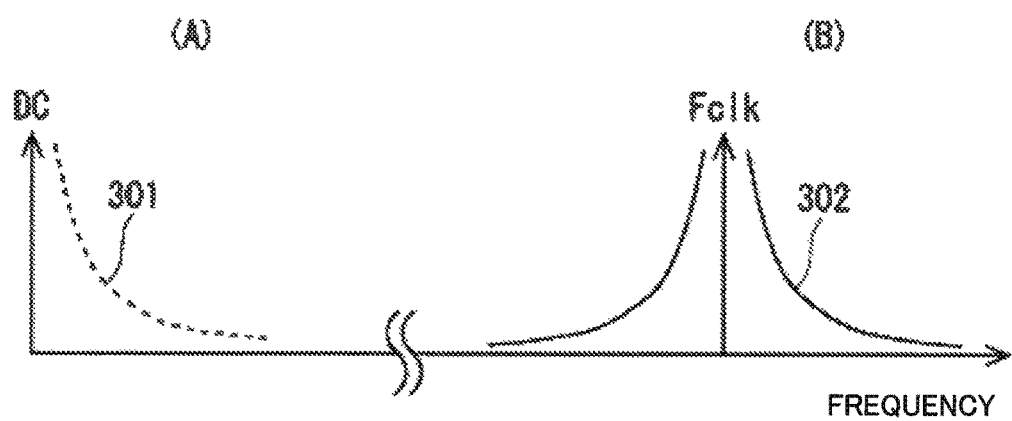
FIG. 13 is a characteristic graph showing a frequency characteristic of the switched capacitor observed on a differential input terminal 101 and a differential input terminal 102 of the variable RF filter of FIG. 11.
Figure 14:
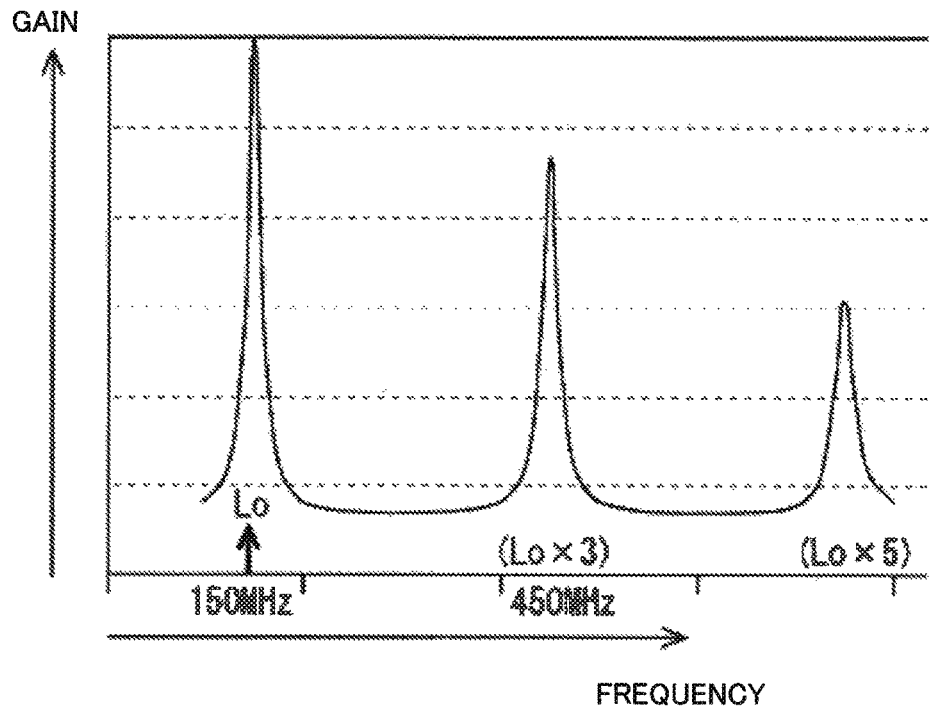
FIG. 14 is a characteristic graph showing a circuit simulation result of the frequency characteristic of the RF variable filter of FIG. 11.

Finally, a fifth example embodiment of the present invention will be described by using a circuit diagram of FIG. 10. FIG. 10 is a circuit diagram showing an example of circuit configuration of a variable RF filter in the fifth example embodiment according to the present invention.

The variable RF filter in the fifth example embodiment according to the present invention includes, as shown in the circuit diagram of FIG. 10, a second passive mixer 1401 operating by an fundamental wave Lo signal 1402 connected across the differential input terminal 501 and the differential input terminal 502 for a differential RF signal (radio frequency signal). In addition, a capacitor 1403 and a first passive mixer 1404 using an inductor 1406 as a load are connected in parallel as loads of the second passive mixer 1401. The first passive mixer 1404 operates by a double-wave Lo signal 1405 which is a double-wave of the fundamental wave Lo signal. Further, as the double-wave Lo signal, a signal is used which has a phase shifted by '45 degrees' with respect to the Lo signal driving the second passive mixer 1401.

The variable RF filter shown in FIG. 10 as the fifth example embodiment is configured in such a way that the first passive mixer 1404 using the inductor 1406 as a load, which is a first stage main passive mixer, is used also as a load of the second passive mixer 1401 using the capacitor 1403 as a load. Accordingly, the number of passive mixers can be reduced. However, since the capacitor 1403 and the inductor 1406 are driven by the same Lo signal 1402, the Lo signal 1402 is limited to a signal having a duty ratio of 50%.

The circuit diagram of FIG. 10 shows a case where, as the load of the one second passive mixer 1401, the only one first passive mixer 1404 using the inductor 1406 as a load is connected in parallel with the capacitor 1403. However, at least two first passive mixers using an inductor as a load may also be configured in such a way as to be connected in parallel as loads of the second passive mixer 1401. Alternatively, a configuration is also possible in which at least two second passive mixer is arranged, to at least one among which is connected at least one first passive mixer in parallel with a capacitor. A clock signal driving each of the first passive mixers is an even-multiple-wave Lo signal which is an even-multiple-wave of the fundamental wave Lo signal (i.e., an even-multiple-wave clock signal which is an even-multiple-wave of a passing RF signal), wherein the phase thereof is shifted by '45 degrees' with respect to the Lo signal 1402 which is a clock signal driving the second passive mixer to be connected.

As mentioned above, the configuration of the preferable example embodiments of the present invention has been described. However, it should be noted that such example embodiments are merely examples of the present invention and do not at all limit the present invention. Those skilled in the art will understand that various modifications and changes can be made depending on specific applications without departing from the spirit of the present invention.

This application claims the priority based on Japanese Patent Application No. 2014-161352, filled on Aug. 7, 2014, the disclosure of which is incorporated herein in its entirety.

REFERENCE SIGNS LIST 101 differential input terminal (IN)
102 differential input terminal (INB)
103 to 106 switches in the first filter block
107 capacitor in first filter block
108 to 111 switch in second filter block
112 capacitor in second filter block
113 to 116 switch in nth filter block
117 capacitor in nth filter block
118 first filter block
119 second filter block
120 n-th filter block
201 CLK1 (first clock signal)
202 CLK2 (second clock signal)
203 CLK3 (third clock signal)
204 CLK4 (fourth clock signal)
205 CLK5 (fifth clock signal)
206 CLK6 (sixth clock signal)
207 CLK7 (seventh clock signal)
208 CLK8 (eighth clock signal)
301 frequency characteristics of capacitor alone
302 frequency characteristic of switched capacitor (passive mixer+capacitor)
501 differential input terminal (IN)
502 differential input terminal (INB)
503 second passive mixer
504 first passive mixer
505 capacitor
506 inductor
507 Lo signal (locally oscillating signal (local oscillation signal))
508 triple-wave Lo signal 601 Lo signal (differential signal)
602 LoB signal (differential signal)
603 to 606 switch
607 triple-wave Lo signal (differential signal)
608 triple-wave LoB signal (differential signal)
609-612 switch
701 Lo_I signal (differential signal)
702 Lo_IB signal (differential signal)
703 Lo_Q signal (differential signal)
704 Lo_QB signal (differential signal)
705 to 712 switch
713 double-wave Lo_I signal (differential signal)
714 double-wave Lo_IB signal (differential signal)
715 double-wave Lo_Q signal (differential signal)
716 double-wave Lo_QB signal (differential signal)
717 amplifier 801 CLK1 (first clock signal)
802 CLK2 (second clock signal)
803 CLK3 (third clock signal)
804 CLK4 (fourth clock signal)
805 Lo_I signal
806 Lo_Q signal
807 Lo_IB signal
808 Lo_QB signal
901 eleventh passive mixer
902 triple-wave Lo signal
903 inductor
904 1n-th passive mixer
905 triple-wave Lo signal
906 inductor
907 first inductor filter
908 n-th inductor filter
909 amplifier
910 21st passive mixer
911 Lo signal
912 capacitor
913 2n-th passive mixer
914 Lo signal
915 capacitor
916 first capacitor filter
917 n-th capacitor filter
918 differential output terminal (OUT)
919 differential output terminal (OUTB)
1001 eleventh passive mixer
1002 first double-wave Lo signal
1003 inductor
1004 twelfth passive mixer
1005 second double-wave Lo signal
1006 inductor
1007 main passive mixer
1008 Lo signal
1301 first passive mixer
1302 double-wave Lo signal
1303 inductor
1304 main passive mixer
1305 Lo signal
1401 second passive mixer
1402 Lo signal
1403 capacitor
1404 first passive mixer
1405 double-wave Lo signal
1406 inductor

The invention claimed is:

1. A variable RF filter configured to receive an input differential radio frequency signal and allow a radio frequency signal around a desired frequency to pass therethrough, the variable RF filter comprising:
at least two first passive mixers configured to be driven by a rectangular wave clock signal having an odd-multiple-wave clock signal having a frequency odd-multiple times as high as that of a fundamental wave of the passing radio frequency signal is connected in parallel to a signal line across an input terminal and an output terminal; and a load of the first passive mixer is configured by an inductor,
wherein the clock signal driving each of the first passive mixers is the odd-multiple-wave clock signal having the frequency odd-multiple times as high as that of a fundamental wave of the passing radio frequency signal.

2. The variable RF filter according to claim 1, wherein the respective clock signals driving the respective first passive mixers are clock signals having the same frequency or clock signals having a different frequency from each other.

3. The variable RF filter according to claim 1, wherein in addition to the at least one first passive mixer connected in parallel to the signal line across the input terminal and the output terminal, at least one second passive mixer is further connected in parallel to the signal line across the input terminal and the output terminal and a load of each of the at least one second passive mixer is configured by a capacitor.

4. The variable RF filter according to claim 3, wherein the clock signal driving each of the at least one second passive mixer connected in parallel to the signal line across the input terminal and the output terminal is a clock signal having the same frequency as that of the fundamental wave of the passing radio frequency signal.

5. The variable RF filter according to claim 3, wherein an amplifier configured to amplify the passing radio frequency signal is at least inserted into a signal line between the at least one first passive mixer and the at least one second passive mixer.

6. The variable RF filter according to claim 3, wherein the at least one first passive mixer using an inductor as a load is connected, in parallel with the capacitor, as a load of at least one among the at least one second passive mixer connected in parallel to the signal line across the input terminal and the output terminal.

7. The variable RF filter according to claim 6, wherein a clock signal driving each of the at least one first passive mixer connected, in parallel with the capacitor, as a load of each of the at least one second passive mixer is an even-multiple-wave clock signal having a frequency even-multiple times as high as that of the fundamental wave of the passing radio frequency signal, and is a clock signal having a phase shifted by 45 degrees with respect to the clock signal driving the connected second passive mixer.

8. A wireless device which comprises at least a variable RF filter comprising at least one passive mixer and comprises a down-converter using a local oscillation signal which is a rectangular wave, wherein the variable RF filter is configured by at least the variable RF filter according to claim 1, and wherein the frequency of the local oscillation signal is the same as the frequency of the fundamental wave of the radio frequency signal passing through the variable RF filter.

9. A variable RF filter configured to receive an input differential radio frequency signal and allow a radio frequency signal around a desired frequency to pass therethrough, the variable RF filter comprising
a main passive mixer configured to be driven by a clock signal having the same frequency as that of a fundamental wave of the passing radio frequency signal is connected in parallel to a signal line across an input terminal and an output terminal, and
at least one first passive mixer configured to be driven by a rectangular wave clock signal having an even-multiple-wave clock signal having a frequency even-multiple times as high as that of the fundamental wave of the passing radio frequency signal and having a load configured by an inductor is connected to the main passive mixer as a load of the main passive mixer,
wherein the clock signal driving each of the at least one first passive mixer is the even-multiple-wave clock signal having the frequency even multiple times as high as that of the fundamental wave of the passing radio frequency signal and has a phase shifted by 45 degrees with respect to the clock signal driving the main passive mixer.

\* \* \* \* \*